US011262495B1

(12) United States Patent
Colburn et al.

(10) Patent No.: US 11,262,495 B1
(45) Date of Patent: Mar. 1, 2022

(54) WAVEGUIDES WITH HIGH REFRACTIVE INDEX GRATINGS MANUFACTURED BY POST-PATTERNING INFUSION

(71) Applicant: Facebook Technologies, LLC, Menlo Park, CA (US)

(72) Inventors: Matthew E. Colburn, Woodinville, WA (US); Giuseppe Calafiore, Redmond, WA (US); Matthieu Charles Raoul Leibovici, Seattle, WA (US); Maxwell Parsons, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 273 days.

(21) Appl. No.: 16/152,411

(22) Filed: Oct. 4, 2018

Related U.S. Application Data

(60) Provisional application No. 62/568,207, filed on Oct. 4, 2017.

(51) Int. Cl.
*G03F 7/20* (2006.01)
*G03F 7/00* (2006.01)
(Continued)

(52) U.S. Cl.
CPC ......... *G02B 6/0065* (2013.01); *G02B 6/0016* (2013.01); *G02B 6/0036* (2013.01);
(Continued)

(58) Field of Classification Search
CPC .. G02B 6/0065; G02B 6/0016; G02B 6/0036; G02B 27/0172
See application file for complete search history.

(56) References Cited

U.S. PATENT DOCUMENTS

| 4,535,041 A * | 8/1985 | Fielding | ................. G03F 7/032 430/1 |
|---|---|---|---|
| 4,746,587 A * | 5/1988 | Nicholas | ............... B82Y 10/00 250/492.2 |

(Continued)

FOREIGN PATENT DOCUMENTS

| JP | 03-146954 | * | 6/1991 | ............... G03F 7/26 |
|---|---|---|---|---|
| JP | H03235331 A | | 10/1991 | |

(Continued)

OTHER PUBLICATIONS

Ciapurin et al., "Modeling of phase volume diffractive gratings, part 1 :transmitting sinusoidal uniform gratings", Opt. Eng., vol. 45(1) 015802 (Jan. 2006).*

(Continued)

*Primary Examiner* — Martin J Angebranndt
(74) *Attorney, Agent, or Firm* — Fenwick & West LLP

(57) ABSTRACT

A manufacturing system for creating waveguides that include optical gratings having high coupling efficiencies is described herein. The waveguides are used to guide image light from a source assembly to an eye of a user. The optical gratings are used to couple light into an optical waveguide element and/or decouple light from the optical waveguide element. The manufacturing system creates optical gratings by patterning and adjusts refractive indexes of the optical gratings by infusion and post-processing. A refractive index of an optical grating can be uniform or non-uniform. In-coupling efficiencies of light into a waveguide via the optical gratings and/or out-coupling efficiencies of light out of a waveguide via the optical gratings can be increased. The manufacturing system includes a patterning system, an infusion system, and a post-processing system.

11 Claims, 7 Drawing Sheets

(51) Int. Cl.
*G03F 7/16* (2006.01)
*G02B 6/00* (2006.01)
*F21V 8/00* (2006.01)
*G02B 27/01* (2006.01)

(52) U.S. Cl.
CPC ............ *G03F 7/0005* (2013.01); *G03F 7/162* (2013.01); *G03F 7/20* (2013.01); *G02B 27/0172* (2013.01)

(56) References Cited

U.S. PATENT DOCUMENTS

| | | | | |
|---|---|---|---|---|
| 4,942,102 A | * | 7/1990 | Keys | B32B 17/10036 430/1 |
| 4,942,112 A | * | 7/1990 | Monroe | G03F 7/027 430/282.1 |
| 4,959,283 A | * | 9/1990 | Smothers | G03F 7/001 430/1 |
| 5,182,180 A | * | 1/1993 | Gambogi, Jr | G03F 7/001 359/1 |
| 5,201,960 A | | 4/1993 | Starov | |
| 5,212,028 A | * | 5/1993 | Fujino | G03F 7/265 430/22 |
| 5,278,029 A | * | 1/1994 | Shirai | G03F 7/265 216/62 |
| 5,483,365 A | | 1/1996 | Pu et al. | |
| 5,658,711 A | * | 8/1997 | Matsuo | G03F 7/265 257/E21.024 |
| 6,358,653 B1 | * | 3/2002 | Turberfield | B82Y 20/00 430/1 |
| 6,378,869 B1 | * | 4/2002 | Hedge, Jr | A63F 3/00157 273/146 |
| 6,379,869 B1 | | 4/2002 | Schroeder et al. | |
| 6,410,383 B1 | * | 6/2002 | Ma | H01L 21/76843 438/247 |
| 6,638,833 B1 | * | 10/2003 | Vassalli | H01L 21/0273 257/E21.026 |
| 6,673,525 B1 | * | 1/2004 | Wheeler | G03F 7/0755 430/313 |
| 10,895,671 B1 | | 1/2021 | Calafiore et al. | |
| 2005/0266356 A1 | * | 12/2005 | Koh | H01L 21/0274 430/323 |
| 2006/0183625 A1 | | 8/2006 | Miyahara | C04B 41/009 501/98.4 |
| 2006/0281320 A1 | * | 12/2006 | Lin | G03F 7/405 438/701 |
| 2007/0164487 A1 | | 7/2007 | Beck et al. | |
| 2008/0166669 A1 | * | 7/2008 | Breyta | G03F 7/0392 430/326 |
| 2009/0073373 A1 | | 3/2009 | Kitson et al. | |
| 2009/0224416 A1 | | 9/2009 | Laakkonen et al. | |
| 2010/0278484 A1 | | 11/2010 | Scheerlinck et al. | |
| 2010/0310995 A1 | | 12/2010 | Chen et al. | |
| 2011/0033664 A1 | | 2/2011 | Dicker et al. | |
| 2011/0244187 A1 | | 10/2011 | Rinko | |
| 2012/0113678 A1 | | 5/2012 | Cornelissen et al. | |
| 2014/0231776 A1 | | 8/2014 | Takahashi et al. | |
| 2014/0255833 A1 | | 9/2014 | Yasuda et al. | |
| 2016/0167422 A1 | * | 6/2016 | Brehm | B42D 25/00 359/567 |
| 2016/0254331 A1 | | 9/2016 | Wang | |
| 2018/0052276 A1 | * | 2/2018 | Klienman | G02C 5/16 |
| 2018/0095201 A1 | | 4/2018 | Melli et al. | |
| 2019/0235142 A1 | | 8/2019 | Meyer Timmerman Thijssen et al. | |
| 2019/0243237 A1 | | 8/2019 | Watkins et al. | |
| 2020/0033530 A1 | | 1/2020 | Colburn et al. | |

FOREIGN PATENT DOCUMENTS

| | | | |
|---|---|---|---|
| JP | 04-335330 | * | 11/1992 |
| JP | H05251864 A | | 9/1993 |
| JP | H11074253 A | | 3/1999 |
| WO | 2018126760 A1 | | 7/2018 |

OTHER PUBLICATIONS

Jang et al., "3D micro and nanostructures via interferences lithography", Adv. Funct. Mater., vol. 17 pp. 3027-3041 (2007).*
Xu, "Fabrication of high fidelity, high index 3D photonic crystals using a templating approach", Thesis, Univ. Penn., 188 pages (Dec. 2009).*
Machine translation of jp-03146954 (1991).*
Aksak B., et al., "Adhesion of Biologically Inspired Vertical and Angled Polymer Microfiber Arrays," Langmuir, 2007, vol. 23 (6), pp. 3322-3332.
Dong L., et al., "One-Step Fabrication of Polymer Components for Microphotonics by Gray Scale Electron Beam Lithography," Journal of the European Optical Society—Rapid Publications, Apr. 8, 2011, vol. 6, pp. 1-8.
Lee J.B., et al., "Innovative SU-8 Lithography Techniques and Their Applications," Micromachines, 2015, vol. 6 (1), pp. 1-19.
Lin T.H., et al., "Inclined Exposure and Incomplete Thermal Reflow Process for Fabricating Asymmetric Microlens Array," DTIP 2012, Cannes, France, Apr. 25-27, 2012, pp. 1-4.
Pang L., et al., "Fabrication of Optical Structures Using SU-8 Photoresist and Chemically Assisted Ion Beam Etching," Optical Engineering, Oct. 2003, vol. 42 (10), pp. 2912-2917.
Parness A., et al., "A Microfabricated Wedge-Shaped Adhesive Array Displaying Gecko-Like Dynamic Adhesion," Directionality and Long Lifetime, Journal of the Royal Society, Mar. 18, 2009, vol. 6, pp. 1223-1232.
Pinto V.C., et al., "Optimized SU-8 Processing for Low-Cost Microstructures Fabrication without Cleanroom Facilities," Micromachines, 2014, vol. 5, pp. 738-755.
Ventola K., et al., "High Phase Retardation by Waveguiding in Slanted Photonic Nanostructures," Optics Express, Jan. 3, 2011, vol. 19 (1), pp. 241-246.
Verhaar T.M., "Pattern Transfer on Vertical Cavity Sidewalls Using SUB," Thesis, Delft University of Technology, Jan. 21, 2009, pp. 1-47.
Wu S-D., et al., "Characteristics of DuPont Photopolymers for Slanted Holographic Grating Formations," Journal Optical Society of America B, Oct. 2004, vol. 21 (10), pp. 1722-1731.

* cited by examiner

WAVEGUIDES WITH HIGH REFRACTIVE INDEX GRATINGS MANUFACTURED BY POST-PATTERNING INFUSION

CROSS-REFERENCE TO RELATED APPLICATION

This application claims the benefit of U.S. Provisional Application No. 62/568,207, filed Oct. 4, 2017, of which the subject matter is incorporated herein by reference in its entirety.

BACKGROUND

Technical Field

The present disclosure generally relates to waveguide displays, and specifically to a method of increasing the refractive index of grating elements based on an infusion of additional materials in waveguide displays.

Background Information

Near-eye light field displays project images directly into a user's eye, encompassing both near-eye displays (NEDs) and electronic viewfinders. Conventional near-eye displays (NEDs) generally have a display element that generates image light that passes through one or more lenses before reaching the user's eye. Additionally, NEDs in augmented reality systems are typically required to be compact and light weight, and to provide large exit pupil with a wide field-of-vision for ease of use. However, designing a conventional NED with materials of desired optical properties often results in a very low out-coupling efficiency of the image light received by the user's eyes due to a low refractive index. Conventional manufacturing systems cannot fabricate NEDs with a desirable in- or out-coupling efficiencies.

SUMMARY

A manufacturing system creates waveguides that include optical gratings having high coupling efficiencies. The waveguides can be used in displays such as near eye displays for guiding image light from a source assembly to an eye of a user. The optical gratings are used to couple light into an optical waveguide element and/or decouple light from the optical waveguide element. The optical waveguide element is a structure that confines image light internally within the optical waveguide element. A refractive index of an optical grating can be uniform or non-uniform. The refractive index of the optical gratings is in the range of 1.7 to 4.0. In-coupling efficiencies of light into a waveguide via the optical gratings and/or out-coupling efficiencies of light out of a waveguide via the optical gratings can be increased.

In various embodiments, the manufacturing system includes a patterning system, an infusion system, and a post-processing system. The patterning system creates optical gratings, for example, by applying a photolithography. After the optical gratings are created, the infusion system and the post-processing system introduce moieties into the optical gratings and cause chemical reactions thereby to change the material of which the optical gratings are composed. The moieties can be reactive, non-reactive, and a combination of reactive and non-reactive moieties. The infusion process can include one or more of reactive infusion, non-reactive infusion, or ion implantation. A concentration of the moieties in an optical grating can be uniform or variable throughout the optical grating. An optical grating including moieties that have a uniform concentration has a uniform refractive index. That is, different portions of the optical grating have the same refractive index. An optical grating including moieties that have a variable concentration has a non-uniform refractive index. That is, different portions of the optical grating may have different indexes of refraction. Reactive infusion and non-reactive infusion can be used to produce optical gratings that have homogenous indexes of refraction, but can also be used to produce variable indexes of refraction. On-axis implantation and/or off-axis implantation can be used to adjust a concentration of moieties at different locations within an optical grating.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview

A manufacturing system for creating waveguides that include optical gratings having high coupling efficiencies is described herein. The waveguides are used to guide image light from a source assembly to an eye of a user. The optical gratings are used to couple light into an optical waveguide element and/or decouple light from the optical waveguide element. The optical waveguide element is a structure that confines image light internally within the optical waveguide element. The manufacturing system creates optical gratings by patterning and adjusts refractive indexes of the optical gratings by infusion and post-processing. A refractive index of an optical grating can be uniform or non-uniform. The refractive index of the optical gratings is in the range of 1.7 to 4.0. In-coupling efficiencies of light into a waveguide via the optical gratings and/or out-coupling efficiencies of light out of a waveguide via the optical gratings can be increased.

The manufacturing system creates optical gratings by patterning. After the optical gratings are created, the manufacturing system performs infusion and post-processing to introduce moieties into the optical gratings. The moieties change the material of the optical gratings. The moieties can be reactive, non-reactive, and a combination of reactive and non-reactive moieties. The infusion process can include one or more of reactive infusion, non-reactive infusion, or ion implantation. A concentration of the moieties in an optical grating can be uniform or variable throughout the optical grating. An optical grating including moieties that have a uniform concentration has a uniform refractive index. That is, different portions of the optical grating have the same refractive index. An optical grating including moieties that have a variable concentration has a non-uniform refractive index. That is, different portions of the optical grating may have different indexes of refraction. Reactive infusion and non-reactive infusion can be used to produce optical gratings that have homogenous indexes of refraction, but can also be used to produce variable indexes of refraction. On-axis implantation and/or off-axis implantation can be used to adjust a concentration of moieties at different locations within an optical grating. The optical grating has a non-uniform refractive index. In various embodiments, the manufacturing system includes a patterning system, an infusion system, and a post-processing system.

Figure 1:
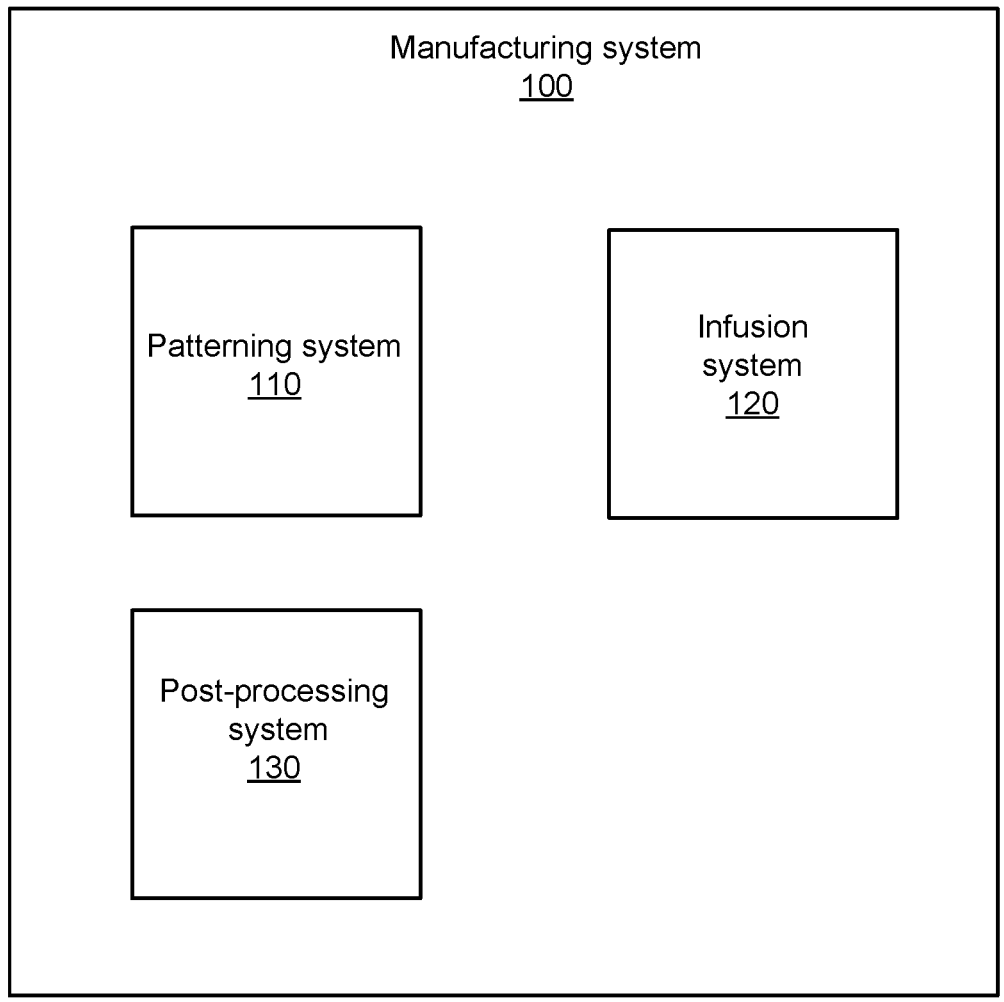
FIG. 1 is a block diagram of a manufacturing system, in accordance with one or more embodiments.

FIG. 1 is a block diagram of a manufacturing system 100, in accordance with one or more embodiments. The manufacturing system 100 includes a group of sub-systems that can be used to create waveguides that include optical gratings. An optical grating can have a uniform or non-uniform refractive index. The waveguides can be used in a waveguide display. The manufacturing system 100 includes a patterning system 110, an infusion system 120, a post-processing system 130, or some combination thereof. The patterning system 110 forms a grating on a substrate. The infusion system 120 and the post-processing system 130 together adjust the refractive index of the grating formed on the substrate. The manufacturing system 100 may be similar to a system of fabricating devices used to form an integrated circuit, and may include such components as an etching component, a thin film manufacturing component, an oxidation component, and so on. In some embodiments, the manufacturing system 100 includes a controller (not shown here) that controls each sub-system.

The patterning system 110 is a system that patterns a substrate assembly thereby to form one or more grating elements on a substrate (e.g., an optical waveguide). A substrate assembly includes a layer of first material formed on the substrate. In various embodiments, the first material is an organic material. The patterning system 110 patterns the layer of first material thereby to change a geometry of the layer of first material formed on the substrate. For example, the patterning system 110 patterns the layer of first material to form a grating that includes one or more grating elements. An individual grating element is an elongated element of the first material. In some embodiments, the patterning system 110 may further coat the grating. The layer of first material can be a resist such as an imprint resist, a shield resist, etc. The grating is susceptible to reactive, diffusive, and/or reactive-diffusive processes.

In some embodiments, the patterning system 110 includes a convection oven, a hot plate, a cool plate, an infrared lamp, a wafer spinner, a mask aligner, an exposure system, a wet bench based developer system, or some combination thereof. In one example, the patterning system 110 includes a pair of convection ovens for processing batches of wafers through hard and soft baking for dehydration purposes at a temperature in the range of 150-200° C., a programmable wafer spinner, a contact-type mask aligner, and an exposure system with a mercury source of intensity close to 25 mW/cm$^2$. The patterning system 110 may also include at least one of a projection lithography system, an imprint lithography system, and an interferometric imaging system. The patterning system 110 may also perform coating the grating by one or more of the following: spin coating, inkjet, drop casting, chemical vapor deposition (CVD), atomic layer deposition (ALD), and/or physical vapor deposition (PVD).

The infusion system 120 is a system that infuses an additional material into the patterned substrate assembly, specifically, the grating formed on the substrate. The additional material includes one or more moieties within molecules that are responsible for the characteristic chemical reactions of the molecules. Infusing one or more moieties into the grating element changes the material of the grating element from the first material to a second material. That is, after the grating element is infused with the one or more moieties, the grating element is composed of the second material. The moieties may be bound or may not be bound to the first material.

The infusion system 120 can perform an infusion process to infuse the one or more moieties into the one or more grating elements formed on the substrate. The moieties can include a reactive moiety, a non-reactive moiety, or a combination of reactive moiety and non-reactive moiety. A reactive moiety is a functional group that reacts chemically to external catalytic factors and forms chemical bonds that bind the additional material with the first material. Example external catalytic factors include heat, light, or an inherent structural morphology of the first material formed on the substrate, or some combination thereof. The infusion system 120 can control the one or more external catalytic factors under which the one or more moieties are infused. A non-reactive moiety is a functional group that infiltrates into the first material formed on the substrate based on a diffusion process. Driving forces such as heat and/or pressure can be applied to enable diffusion without causing any chemical reaction.

In alternate embodiments, the infusion system 120 includes an ion implantation system that implants the additional material (e.g. moieties) into the first material. The ion implantation system is a system that accelerates ionized atoms of moieties through an electrostatic field to strike a surface of a grating element. The ion implantation system implants the additional material in different configurations, including, but not restricted to an on-axis implantation, an off-axis implantation, or some combination thereof. In the on-axis implantation, the moiety strikes the surface of the grating element along a direction that is normal to the surface. In the off-axis implantation, the moiety strikes the surface of the grating element along any arbitrary direction with respect to the surface. To perform the off-axis implantation, the ion implantation system can be oriented at a tilt angle in the range of 0 to 90 degrees with respect to the surface of the patterned substrate assembly. The ion implantation system can also implant a neutral particle such as an accelerated ion that is neutralized.

The post-processing system 130 processes the infused and patterned substrate assembly. The post-processing system 130 changes the second material to a third material by causing the second material to undergo a chemical reaction. The chemical reaction may be between the first material and the one or more moieties infused by the infusion system 120, the second material and one or more moieties diffused by the post-processing system 130, or a combination thereof. The third material has a different refractive index from that of the first material. As such, a refractive index of a grating element is adjusted.

In some embodiments, the post-processing system 130 includes a diffusion furnace, a wet bench, a convection oven, a hotplate, a rapid thermal processing system, or some combination thereof. The diffusion furnace is a furnace that drives one or more moieties into the infused and patterned substrate assembly at a range of temperatures and/or pressures in environments such as vacuum, nitrogen, dry air, etc. The moieties are the same or similar to the moieties infused by the infusion system 120. In one example, a pressure differential inside the diffusion furnace drives the moieties into the infused and patterned substrate assembly. In another example, the diffusion furnace is a near room temperature furnace that reduces a diffusion speed of the moieties into the first material. In some configurations, the diffusion furnace may be operated at a temperature in the range of 50° C. to 400° C. that is selected based on the decomposition temperature of a material of the substrate and/or the first material that is formed on the substrate. In some embodiments, the post-processing system 130 performs a heating process including, but not restricted to, an adiabatic process, a thermal flux process, and an isothermal process. The wet bench allows an application of an acid that can cause the chemical reaction of the second material. The rapid thermal processing system is a single wafer hot processing system that minimizes the thermal budget of a process by reducing the time at a given temperature in addition to, or instead of, reducing the temperature.

In some embodiments, the manufacturing system 100 includes a plurality of post-processing systems 130 and a controller (not shown) that controls the post-processing systems 130. For example, the controller controls a first post-processing system 130 to modify the refractive index of a grating element to a first value according to a first processing instruction. The controller controls a second post-processing system 130 to modify the refractive index of the refractive index of a grating element to a second value according to a second processing instruction. The manufacturing system 100 can create a grating element that has a non-uniform refractive index by regulating a process condition. As a first example, to adjust concentrations of moieties at different locations in the third material, the manufacturing system 100 controls locations on a surface of a grating element and/or implantation angles of an ion implantation process. As another example, to adjust concentrations of moieties at different locations in the third material, the manufacturing system 100 regulates a temperature across a grating element thereby to control the diffusion of the moieties.

Figure 2:
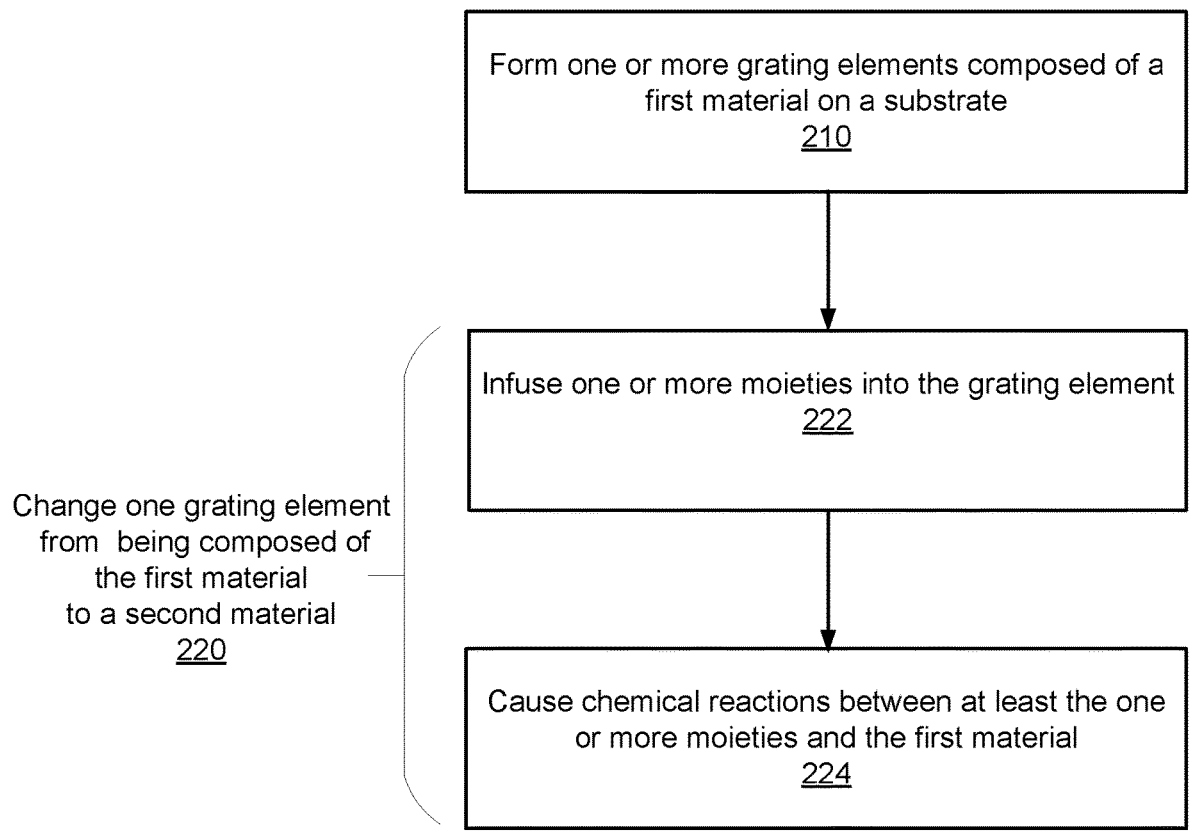
FIG. 2 is a flowchart illustrating the post-patterning infusion performed by the manufacturing system of FIG. 1, in accordance with one or more embodiments.

FIG. 2 is a flowchart 200 illustrating a process of the manufacturing system 100 of FIG. 1 manufacturing waveguides, in accordance with one or more embodiments.

The patterning system 110 forms 210 one or more grating elements on a substrate. For example, the patterning system patterns a layer of a material on the substrate. In some embodiments, the patterning system performs a lithographic patterning of photoresist on a substrate assembly including the substrate and the layer of material formed on the substrate. In one example, the patterning system 110 includes a convection oven for dehydration of the substrate at 150-200° C., a wafer spinner for coating the substance on the substrate, a mask aligner for defining the lithographic pattern on the substrate, and an exposure system for transferring the lithographic pattern in the mask to the substrate. In alternate configurations, the patterning system 110 transfers the substrate from each of the convection oven, the wafer spinner, the mask aligner and the exposure system using a set of mechanical arms that are coupled to a controller.

Subsequently, the manufacture system 100 changes 220 the grating from being composed of the first material to a second material. The second material has a refractive index that is greater than that of the first material. As such, the manufacture system 100 increases a refractive index of the grating of the waveguide.

To increase the refractive index, the infusion system 120 infuses 222 one or more moieties into a grating element formed on the substrate. For example, the infusion system 120 performs a reactive infusion of moieties, a non-reactive infusion of moieties, an implantation of moieties, or some combination thereof. The implantation of moieties can be on-axis, off-axis, or some combination thereof. The reactive infusion process, non-reactive infusion process, and implantation process are further described in connection with FIGS. 1 and 3-5.

To increase the refractive index, the post-processing system 130 causes 224 chemical reactions between at least the one or more moieties and the first material thereby to transform the first material to the second material. For example, the post-processing system 130 performs a processing of the patterned substrate based on a chemical reaction, a thermal diffusion, a pressure differential, an irradiation or some combination thereof. In some embodiments, the post-processing system 130 performs a rapid thermal annealing of the infused and patterned substrate to create a range of refractive indices for the optical grating.

Figure 3:
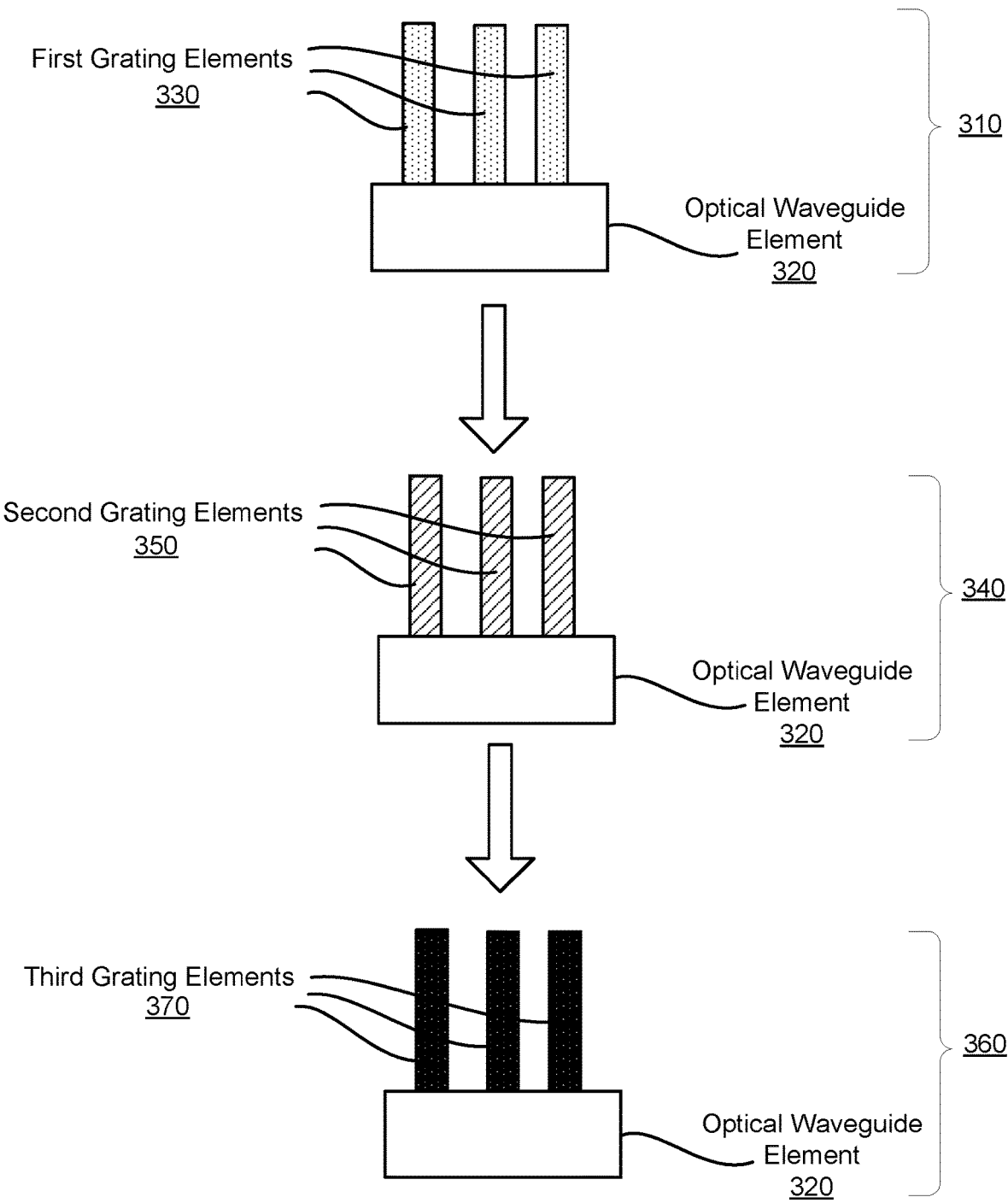
FIG. 3 is an illustration of a reactive infusion performed by the manufacturing system, in accordance with one or more embodiments.

FIG. 3 is an illustration of a reactive infusion 300 performed by the manufacturing system 100, in accordance with one or more embodiments. The manufacturing system 100 performs 310 a patterning on an optical waveguide element 320 to form one or more first grating elements 330. The optical waveguide element 320 is a physical structure that confines light within the structure. An example optical waveguide element 320 is the optical waveguide element 720 described below in detail in conjunction with FIG. 7. The first grating element 330 is composed of an organic material such as t-butyl methacrylate (PtBMA). Organic polymers containing any blocking agent that is acid cleavable can also be used. The one or more first grating elements 330 can be formed directly on the optical waveguide element 320 as described above. Alternatively, the manufacturing system 100 forms the first grating elements 330 on a first substrate and transfers the one or more first grating elements 330 from the first substrate onto the optical waveguide element 320. The manufacturing system 100 performs 340 a reactive infusion on the one or more first grating elements 330 to form one or more second grating elements 350. In some configurations, the one or more second grating elements 350 include a surface morphology that is rendered by infusion of one or more moieties (e.g. acidic) that are reactive to external catalytic conditions along the periphery of the first grating elements 330. The external catalytic conditions include heat, light, a design of the organic material of the one or more first grating elements 330, or some combination thereof. In alternate configurations, the organic material of the one or more first grating elements 330 is reactivated to promote the reactive infusion 340.

The manufacturing system 100 performs 360 a post-processing of the one or more second grating elements 350 to form one or more third grating elements 370. The reactive infusion involves diffusing a moiety into a patterned film and causing the moiety in the patterned film to react into a designed functionality. The chemical reaction forms a covalent or ionic bond with the patterned matrix. In some configurations, the one or more third grating elements 370 includes a plurality of moieties binding with the one or more second grating element 350.

In some embodiments, the manufacturing system 100 performs the reactive infusion 300 based on a sol gel chemical reaction thereby to produce solid materials of metal oxides (e.g. $Ta_2O_5$, $HfO_2$) from small molecules. For example, the manufacturing system 100 infuses $TiCl_4$ to an organic material to generate $TiO_x$ based on an acetic acid catalysis of $TiCl_4$.

As one example, the manufacturing system 100 performs 310 a lithographic patterning to form the one or more first grating elements 330 composed of t-butyl methacrylate (PtBMA). The manufacturing system 100 performs 340 a reactive infusion to form the one or more second grating elements 350 composed of Poly(methacrylic acid) (PMAA). The one or more second grating elements 350 are formed by a chemical reaction between t-butyl methacrylate (PtBMA) and an acid (e.g. acetic acid, glass reinforced polyamide (PAG)) at a target temperature. This target temperature is determined based on the activation energy of the acid. The manufacturing system 100 performs 360 a post-processing to form the one or more third grating elements 370 composed of PTiMA. PTiMA is a titinated polymethacrylate. The titinate may have a host of ligands such as tetrabutoxy titinate. Other materials can be silylation agents. The one or more third grating elements 370 are formed by a reactive infusion 300 of $TiR_x$ into PMAA. The one or more third grating elements 370 have a refractive index in the range of 1.8 to 2.4.

The one or more first grating elements 330, second grating elements 350, and third grating elements 370 couple light into or decouple light out of the optical waveguide element 320. The one or more grating elements 330, 350, 370 may be, e.g., a diffraction grating, a holographic grating, some other element, or some combination thereof. An example of these grating elements is the coupling element 750 or the decoupling element 760 as described in detail below in conjunction with FIG. 7. The one or more grating elements 330, 350, 370 have the same physical structure (e.g., dimension) and may have different coupling or decoupling efficiencies. In the example of FIG. 3, the one or more third grating elements 370 are arranged into a one-dimensional array. Alternatively, the one or more third grating elements 370 can be arranged into a two-dimensional array.

Figure 4:
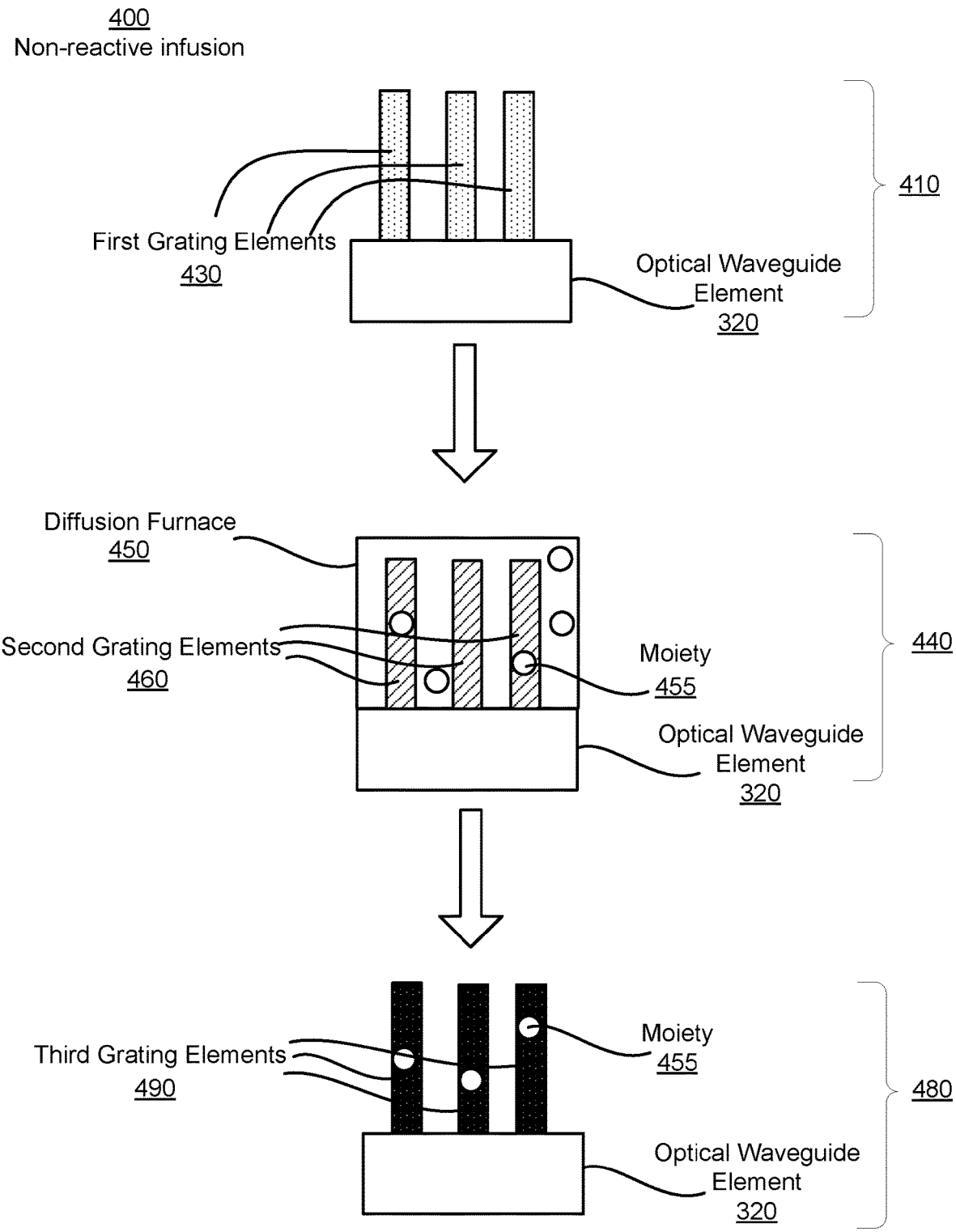
FIG. 4 is an illustration of a non-reactive infusion performed by the manufacturing system, in accordance with one or more embodiments.

FIG. 4 is an illustration of a non-reactive infusion 400 performed by the manufacturing system 100, in accordance with one or more embodiments. The manufacturing system 100 performs 410 a patterning on an optical waveguide element 320 to form one or more first grating elements 430. The one or more first grating elements 430 are similar to the one or more grating elements 330 described in connection with FIG. 3.

The manufacturing system 100 performs 440 a non-reactive infusion of a plurality of moieties 455 into the one or more first grating elements 430 to form one or more second grating elements 460. The diffusion of the plurality of moieties 455 into the one or more grating elements 430 may be performed under an external bias such as heat, pressure, or some combination thereof. For example, the manufacturing system 100 subjects the moieties 455 to a combination of heat and pressure in the diffusion furnace 450 to perform the non-reactive infusion 440. The manufacturing system 100 performs 480 a post-processing of the one or more second grating elements 460 to form one or more third grating elements 490. In some configurations, a concentration of the moieties 455 in the one or more third grating elements 490 is uniform along both the vertical and horizontal dimensions of the one or more third grating elements 490. The moieties 455 are present in a region of the one or more third grating elements 490. In some cases, the region is of a shallow depth and underneath the exterior surface of the one or more second grating elements 460 that is exposed to diffusion. The concentration of the moieties may be in the range of 0 to 99%. For very porous films, the concentration of the moieties has a threshold value of around 50% without creating a large swelling. In the non-reactive situation, the processing enables the diffusion at an elevated temperature or enhanced diffusivity (ex. solvent plasticitization)). Compositional differences between regions (or gratings) would enable solubility differences. This imparts concentration and optical property differences. Non-reactive implies not covalent or ionic bonds are formed. There can be hydrogen bonding.

In the example of FIG. 4, the one or more third grating elements 490 are arranged into a one-dimensional array. Alternatively, the one or more third grating elements 490 can be arranged into a two-dimensional array.

Figure 5:
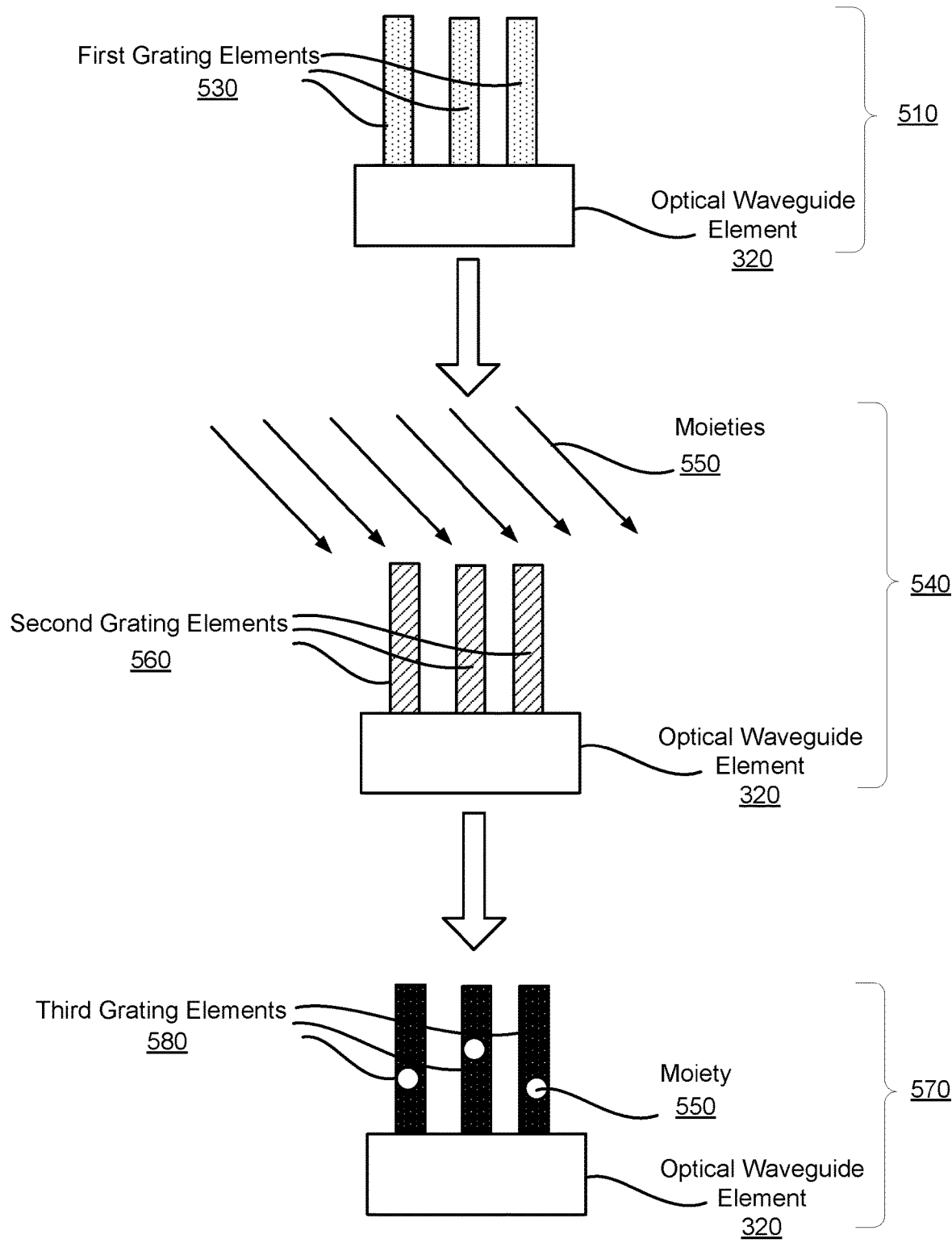
FIG. 5 is an illustration of an ion-implantation based infusion performed by the manufacturing system, in accordance with one or more embodiments.

FIG. 5 is an illustration of an ion-implantation based infusion 500 performed by the manufacturing system 100, in accordance with one or more embodiments. The manufacturing system 100 performs 510 a patterning on an optical waveguide element 320 to form one or more first grating elements 530. The one or more first grating elements 530 are similar to the one or more grating elements 330 described in connection with FIG. 3.

The manufacturing system 100 performs 540 an ion implantation of moieties 550 on the one or more first grating elements 530 to form one or more second grating elements 560. As described above, the ion implantation 550 can be an on-axis ion implantation, an off-axis implantation, or some combination thereof. The type of implants and the implantation parameters may be defined by the aspect ratio of the one or more first grating elements 530. In one embodiment, the manufacturing system 100 subjects the moieties 550 to an on-axis implantation followed by an off-axis implantation to infuse the moieties 550 into the one or more second grating elements 560.

The manufacturing system 100 performs 570 a post-processing of the one or more second grating elements 560 to form one or more third grating elements 580. In some configurations, a concentration of the moieties 550 in the one or more third grating elements 580 is uniform throughout the one or more third grating elements 580. The moieties 455 are present in a region of the one or more third grating elements 490. The region is of a shallow depth and underneath the exterior surface of the one or more second grating elements 560 that is exposed to ion implantation. The ion implantation approach is a means to infuse material that is directional and energetic in nature rather than thermal. These moieties can be reactive or nonreactive. The implantation also relates to solubility.

As one example, the one or more first grating elements 530 are made of a resin and has a refractive index in the range of 1.5. The one or more third grating elements 580 have a concentration of moieties of around 50% and has a refractive index of around 2.0. In the example of FIG. 5, the one or more third grating elements 580 are arranged into a one-dimensional array. Alternatively, the one or more third grating elements 580 can be arranged into a two-dimensional array.

Figure 6:
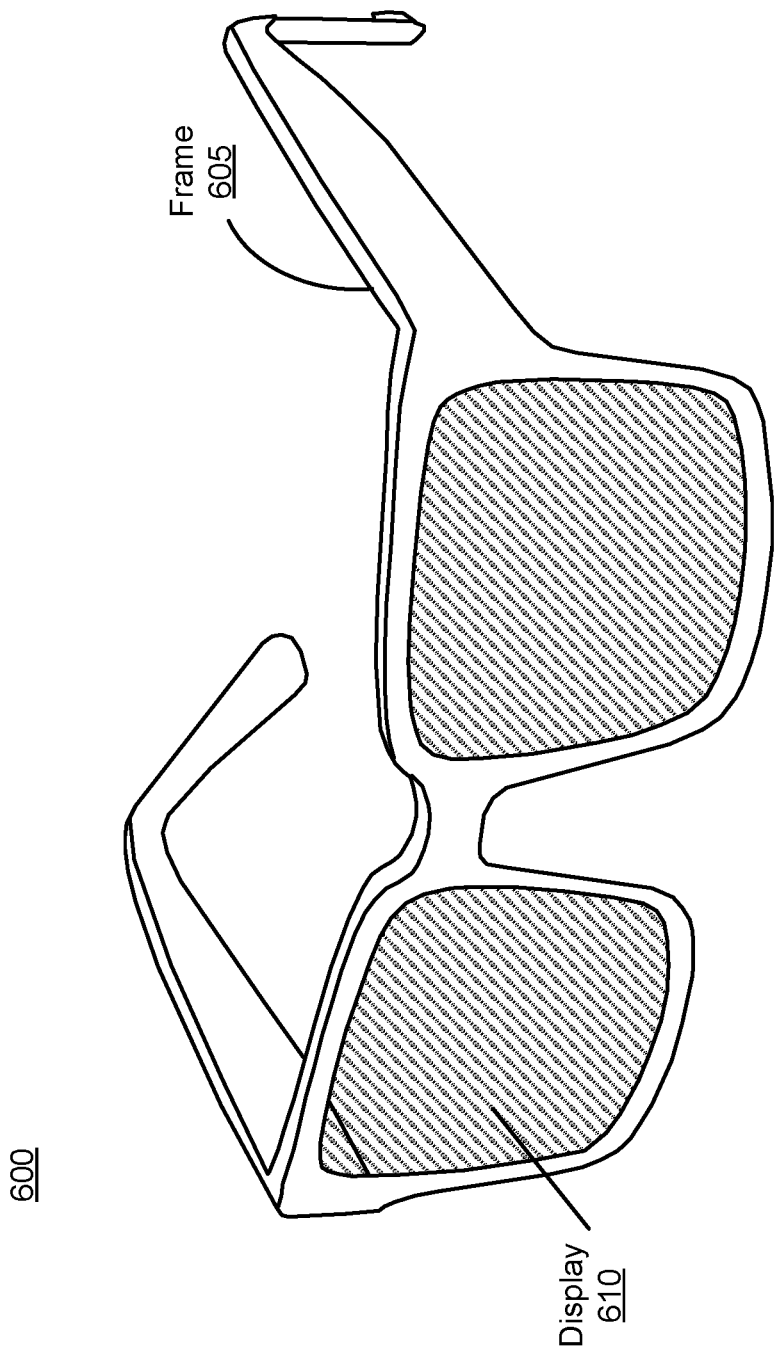
FIG. 6 is a diagram of a near-eye-display (NED) fabricated using the manufacturing system, in accordance with one or more embodiments.

FIG. 6 is a diagram of a near-eye-display (NED) 600 fabricated using the manufacturing system 100, in accordance with one or more embodiments. The NED 600 presents media to a user. Examples of media presented by the NED 600 include one or more images, video, audio, or some combination thereof. In some embodiments, audio is presented via an external device (e.g., speakers and/or headphones) that receives audio information from the NED 600, a console (not shown), or both, and presents audio data based on the audio information. The NED 600 is generally configured to operate as a VR NED. However, in some embodiments, the NED 600 may be modified to also operate as an augmented reality (AR) NED, a mixed reality (MR) NED, or some combination thereof. For example, in some embodiments, the NED 600 may augment views of a physical, real-world environment with computer-generated elements (e.g., images, video, sound, etc.).

The NED 600 shown in FIG. 6 includes a frame 605 and a display 610. The frame 605 includes one or more optical elements which together display media to users. The display 610 is configured for users to see the content presented by the NED 600. As discussed below in conjunction with FIG. 7, the display 610 includes at least one source assembly to generate an image light to present media to an eye of the user. The source assembly includes, e.g., a source, an optics system, or some combination thereof.

FIG. 6 is only an example of a VR system. However, in alternate embodiments, FIG. 6 may also be referred to as a Head-Mounted-Display (HMD).

Figure 7:
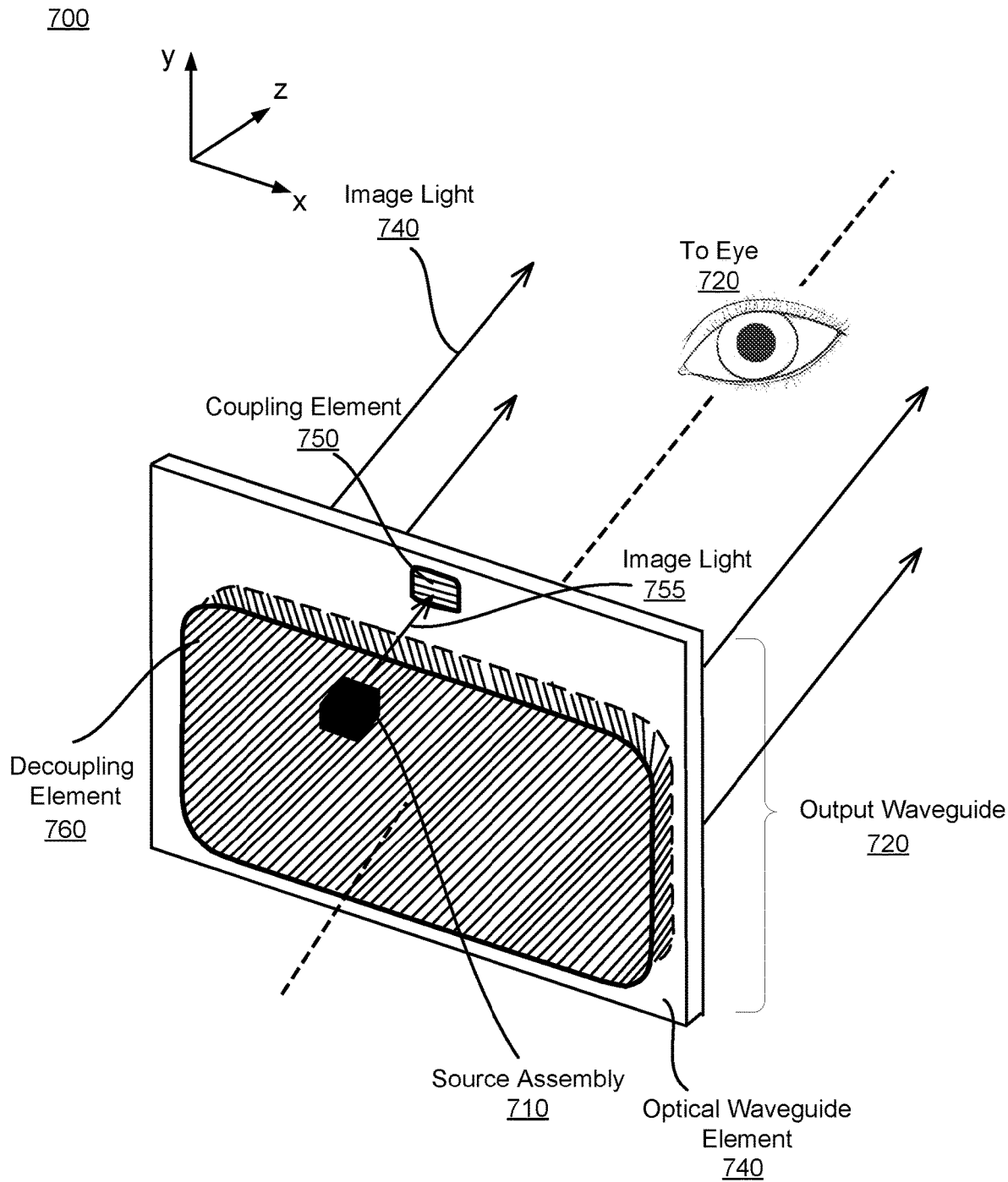
FIG. 7 illustrates an isometric view of a waveguide display fabricated using the manufacturing system, in accordance with one or more embodiments.

FIG. 7 illustrates an isometric view of a waveguide display 700 fabricated using the manufacturing system 100, in accordance with one or more embodiments. The waveguide display 700 can be a part of a system that directs display image light to a particular location such as a NED. For example, the waveguide display 700 is the display 610 of the NED 600 described in connection with FIG. 6.

The waveguide display 700 includes a source assembly 710, and an output waveguide 720. The source assembly 710 generates an image light. The source assembly 710 includes a source array and an optics system (not shown here). The source assembly 710 generates and outputs an image light 755 to a coupling element 750 of the output waveguide 720.

The output waveguide 720 guides image light from the source assembly 710 to an eye 720 of a user. Specifically, the output waveguide 720 guides the image light 755 to propagate along a path defined via one or more coupling elements 750, an optical waveguide element 740, and one or more decoupling elements 760.

The coupling element 750 couples the image light 755 from the source assembly 710 into the optical waveguide element 740. The coupling element 750 may be, e.g., a diffraction grating, a holographic grating, or another structure that couples the image light 755 into the optical waveguide element 740, or some combination thereof. In embodiments where the coupling element 750 is a diffraction grating, the pitch of the diffraction grating is chosen such that total internal reflection occurs. That is, the image light 755 propagates toward the decoupling element 760 internally through the output waveguide 720. For example, the pitch of the diffraction grating is in the range of 300 nm to 600 nm. The manufacturing system 100 performs a post-patterning infusion of moieties 455 into the coupling element 750 to adjust the refractive index as described above in conjunction with FIGS. 1-5.

The optical waveguide element 740 is a physical structure that confines image light received from the coupling element 750 within the optical waveguide element 740, for example, by total internal reflection.

The decoupling element 760 decouples the image light that propagates internally through output waveguide 720, such as the totally internally reflected image light. The decoupling element 760 may be, e.g., a diffraction grating, a holographic grating, some other element that decouples the image light 740 out of the output waveguide 720, or some combination thereof. In embodiments where the decoupling element 760 is a diffraction grating, the pitch of the diffraction grating is chosen to cause incident image light to exit the output waveguide 720. For example, the pitch of the diffraction grating may be in the range of 300 nm to 600 nm. The manufacturing system 100 performs a post-patterning infusion of moieties 455 into the decoupling element 760 to adjust the refractive index as described above in conjunction with FIGS. 1-5.

Additional Configuration Information

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the invention may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A method comprising:

forming one or more grating elements on a substrate by patterning a layer of a first material, the first material having a first refractive index value; and changing a portion of the one or more grating elements from being composed of the first material to a second material, the second material having a second refractive index value greater than the first refractive index value, the changing comprising:

ion implanting additional material including moieties into the portion of the one or more grating elements, wherein the ion implanting the additional material comprises applying, ionized atoms of the moieties to strike a first portion of a surface of the portion of the one or more grating elements in a direction that is normal to the first portion of the surface, and subsequently applying the ionized atoms of the one or more moieties to strike a second portion of the surface of the one or more grating elements at a tilt angle with respect to the surface to infuse at least some of the moieties into the one or more grating elements, wherein the second portion of the surface includes the first portion of the surface and an additional portion of the surface, and causing chemical reactions between the moieties infused in the first material, the chemical reactions transforming the first material to the second material, wherein the second material has a refractive index of at least 1.7, wherein the formed one or more grating elements including the portion having the second refractive index value are configured to couple light into an optical waveguide or decouple light from the optical waveguide.

2. The method of claim 1, wherein the first material is an organic material.

3. The method of claim 1, wherein the layer of the first material is formed on the substrate and includes a photoresist, and wherein patterning the layer of the first material comprises applying a photolithography process on the first material.

4. The method of claim 1, wherein the first material includes a photoresist and patterning the layer of the first material comprises applying a photolithography process on the first material.

5. The method of claim 1, wherein the first material is formed on a second substrate and forming the one or more grating elements comprises transferring the one or more grating elements from the second substrate to the first substrate.

6. The method of claim 1, wherein the one or more moieties comprise an acid, and the chemical reactions comprises a chemical reaction between the acid and the first material rendering a surface morphology along a periphery of the grating element.

7. The method of claim 6, wherein the chemical reaction between the acid and the first material transforms the first material to a third material, and a second chemical reaction between the third material and a second moiety of the one or more moieties transform the third material to the second material.

8. The method of claim 1, wherein a concentration of the one or more moieties in the grating element is uniform before the chemical reactions.

9. The method of claim 1, wherein the one or more moieties is present in a region of the grating element before the chemical reactions.

10. The method of claim 1, wherein the second material has a refractive index of at most 4.0.

11. The method of claim 1, wherein:

one or more of the grating elements include moieties that have a variable concentration; and the formed one or more grating elements including moieties with the variable concentration have a non-uniform refractive index.

* * * * *